United States Patent
Hwang

(10) Patent No.: US 9,559,700 B2
(45) Date of Patent: Jan. 31, 2017

(54) ELECTRONIC DEVICE AND ELECTRONIC SYSTEM INCLUDING THE SAME

(71) Applicant: SK hynix Inc., Gyeonggi-do (KR)

(72) Inventor: Won-Seok Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 158 days.

(21) Appl. No.: 14/569,263

(22) Filed: Dec. 12, 2014

(65) Prior Publication Data
US 2016/0036448 A1 Feb. 4, 2016

(30) Foreign Application Priority Data
Jul. 31, 2014 (KR) .................. 10-2014-0098096

(51) Int. Cl.
*H03K 23/50* (2006.01)
*H03K 21/02* (2006.01)

(52) U.S. Cl.
CPC ............ *H03K 23/50* (2013.01); *H03K 21/023* (2013.01)

(58) Field of Classification Search
CPC ....... H03K 21/02; H03K 21/023; H03K 23/50
See application file for complete search history.

(56) References Cited

U.S. PATENT DOCUMENTS

| | | | | |
|---|---|---|---|---|
| 6,219,798 B1* | 4/2001 | Choi | ...................... | H03K 21/38 377/107 |
| 7,292,177 B2* | 11/2007 | Muramatsu | ............ | H03K 23/56 341/118 |
| 7,555,094 B2* | 6/2009 | Shin | ........................ | H03K 21/38 377/54 |
| 7,990,304 B2* | 8/2011 | Lim | ...................... | H03K 21/023 341/155 |
| 8,330,635 B2* | 12/2012 | Hisamatsu | ............. | H03K 23/62 341/118 |
| 8,395,539 B2* | 3/2013 | Lim | .................... | H03M 1/0607 341/155 |
| 9,042,508 B2* | 5/2015 | Hisamatsu | ........... | H03K 21/023 377/116 |

FOREIGN PATENT DOCUMENTS

| | | |
|---|---|---|
| KR | 1019990086022 | 12/1999 |
| KR | 100723517 | 5/2007 |

* cited by examiner

*Primary Examiner* — Patrick O'Neill
(74) *Attorney, Agent, or Firm* — I P & T Group LLP

(57) ABSTRACT

An electronic device includes a control logic portion suitable for generating a hold control signal based on a count enable signal, and a counting portion suitable for performing a counting operation while a latch operation stops during a counting section and performing the latch operation while the counting operation stops during a holding section based on the hold control signal and a counting clock signal.

16 Claims, 9 Drawing Sheets

ELECTRONIC DEVICE AND ELECTRONIC SYSTEM INCLUDING THE SAME

CROSS-REFERENCE TO RELATED APPLICATIONS

The present application claims priority of Korean Patent Application No. 10-2014-0098096, filed on Jul. 31, 2014, which is incorporated herein by reference in its entirety.

BACKGROUND

1. Field

Various embodiments of the present invention relate to a semiconductor design technology and, more particularly, to an electronic device supporting a counting operation and an electronic system including the same.

2. Description of the Related Art

Counting circuits may be used for various electronic devices to convert physical parameters, such as light intensity, sound intensity or time, into digital signals.

For example, a complementary metal oxide semiconductor (CMOS) image sensor acquires an image using semiconductors that respond to incident light, analog-to-digital converters (ADC) to convert analog signals (i.e., a pixel signal) outputted from a pixel array into digital signals. An ADC may include a counting circuit that performs counting operations using a clock signal.

The operating speed and power consumption of the counting circuit have a direct influence on the performance of a device or system including the counting circuit.

For example, the number of counting circuits included in the CMOS image sensor may increase depending on the resolution of the CMOS image sensor. As the number of counting circuits increases, the operating speed and power consumption of the counting circuits may become an important factor in determining overall performance of the CMOS image sensor.

SUMMARY

Various embodiments of the present invention are directed to an electronic device appropriate for a high-speed counting operation and an electronic system including the electronic device.

In accordance with an embodiment of the present invention, an electronic device includes: a first portion suitable for generating a hold control signal based on a count enable signal; and a second portion suitable for performing a counting operation while a latch operation stops during a counting section and performing the latch operation while the counting operation stops during a holding section based on the hold control signal and a counting clock signal.

The second portion may include a plurality of division blocks suitable for generating a plurality of division clock signals divided at respectively predetermined division ratios as compared with the counting clock signal during the counting section and latching the division clock signals during the holding section based on the counting clock signal or one among the division clock signals and the hold control signal.

The division blocks may include a plurality of first gating units suitable for outputting a plurality of complementary division signals based on the counting clock signal or one among the division clock signals; a plurality of first inversion units suitable for inverting a plurality of first output signals outputted from the first gating units; a plurality of second inversion units suitable for inverting a plurality of first inversion signals outputted from the first inversion units and feeding back the inverted first inversion signals to the first inversion units; a plurality of second gating units suitable for selectively coupling the first inversion units and the second inversion units with each other based on the hold control signal; a plurality of third gating units suitable for outputting the first inversion signals based on an inversion signal of the counting clock signal or an inversion signal among the division clock signals; a plurality of third inversion units suitable for inverting a plurality of second output signals outputted from the third gating units and generating the division clock signals; a plurality of fourth inversion units suitable for inverting the division clock signals and feeding back the inverted division clock signals to the third inversion units; and a plurality of fourth gating units suitable for selectively coupling the third inversion units and the fourth inversion units with each other based on the hold control signal.

The second gating units may be formed between input terminals of the first inversion units and output terminals of the second inversion units and continuously decouple the first inversion units and the second inversion units from each other during the counting section and continuously couple the first inversion units and the second inversion units with each other during the holding section, and the fourth gating units may be formed between input terminals of the third inversion units and output terminals of the fourth inversion units and continuously decouple the third inversion units and the fourth inversion units from each other during the counting section and continuously couple the third inversion units and the fourth inversion units with each other during the holding section.

The division blocks may include a plurality of first gating units suitable for outputting a plurality of complementary division signals based on the counting clock signal or one among the division clock signals; a plurality of first inversion units suitable for inverting a plurality of first output signals outputted from the first gating units; a plurality of second inversion units suitable for inverting a plurality of first inversion signals outputted from the first inversion units based on the hold control signal and feeding back the inverted first inversion signals to the first inversion units; a plurality of second gating units suitable for outputting the first inversion signals based on an inversion signal of the counting clock signal or an inversion signal among the division clock signals; a plurality of third inversion units suitable for inverting a plurality of second output signals outputted from the second gating units and generating the division clock signals; and a plurality of fourth inversion units suitable for inverting the division clock signals based on the hold control signal and feeding back the inverted division clock signals to the third inversion units.

Each of the second inversion units and the fourth inversion units may include a gated inverter that is disabled during the counting section and enabled during the holding section based on the hold control signal.

In accordance with an embodiment of the present invention, an electronic device includes: a control logic portion suitable for generating a hold control signal and a counting clock signal based on a count enable signal and a source clock signal; a lower-level bit counting portion suitable for performing a counting operation while a latch operation stops during a counting section and performing the latch operation while the counting operation stops during a holding section based on the hold control signal and the counting clock signal; and an upper-level bit counting portion suitable for performing the counting operation while the latch operation selectively stops during the counting section and performing the latch operation while the counting operation stops during the holding section based on an uppermost lower-level bit signal among one or more lower-level bit signals outputted from the lower-level bits counting portion.

The control logic portion may include a clock sampling block suitable for generating the counting clock signal toggling during the counting section based on the count enable signal and the source clock signal; and an inversion block suitable for inverting the count enable signal to generate the hold control signal.

The lower-level bit counting portion may include a plurality of lower-level bit division blocks suitable for generating a plurality of lower-level bit signals divided at respectively predetermined division ratios as compared with the counting clock signal during the counting section and latching the lower-level bit signals during the holding section based on the counting clock signal or one among the lower-level bit signals and the hold control signal.

The lower-level bit division blocks may include a plurality of first gating units suitable for receiving a plurality of complementary lower-level bit signals based on the counting clock signal or one among the lower-level bit signals; a plurality of first inversion units suitable for inverting a plurality of first output signals outputted from the first gating units; a plurality of second inversion units suitable for inverting a plurality of first inversion signals outputted from the first inversion units and feeding back the inverted first inversion signals to the first inversion units; a plurality of second gating units suitable for selectively coupling the first inversion units and the second inversion units with each other based on the hold control signal; a plurality of third gating units suitable for outputting the first inversion signals based on an inversion signal of the counting clock signal or an inversion signal among the lower-level bit signals; a plurality of third inversion units suitable for inverting a plurality of second output signals outputted from the third gating units and generating the lower-level bit signals; a plurality of fourth inversion units suitable for inverting the lower-level bit signals and feeding back the inverted lower-level bit signals to the third inversion units; and a plurality of fourth gating units suitable for selectively coupling the third inversion units and the fourth inversion units with each other based on the hold control signal.

The second gating units may be formed between input terminals of the first inversion units and output terminals of the second inversion units and continuously decouple the first inversion units and the second inversion units from each other during the counting section and continuously couple the first inversion units and the second inversion units with each other during the holding section, and the fourth gating units may be formed between input terminals of the third inversion units and output terminals of the fourth inversion units and continuously decouple the third inversion units and the fourth inversion units from each other during the counting section and continuously couple the third inversion units and the fourth inversion units with each other during the holding section.

The lower-level bit division blocks may include a plurality of first gating units suitable for receiving a plurality of complementary lower-level bit signals based on the counting clock signal or one among the lower-level bit signals; a plurality of first inversion units suitable for inverting a plurality of first output signals outputted from the first gating units; a plurality of second inversion units suitable for inverting a plurality of first inversion signals outputted from the first inversion units based on the hold control signal and feeding back the inverted first inversion signals to the first inversion units; a plurality of second gating units suitable for outputting the first inversion signals based on an inversion signal of the counting clock signal or an inversion signal among the lower-level bit signals; a plurality of third inversion units suitable for inverting a plurality of second output signals outputted from the second gating units and generating the lower-level bit signals; and a plurality of fourth inversion units suitable for inverting the lower-level bit signals based on the hold control signal and feeding back the inverted lower-level bit signals to the third inversion units.

Each of the second inversion units and the fourth inversion units may include a gated inverter that is disabled during the counting section and enabled during the holding section based on the hold control signal.

The upper-level bit counting portion may include a plurality of upper-level bit division blocks suitable for generating a plurality of upper-level bit signals divided at respectively predetermined division ratios as compared with the uppermost lower-level bit signal during the counting section and latching the upper-level bit signals during the holding section based on the uppermost lower-level bit signal or one among the upper-level bit signals.

The upper-level bit division blocks may include a plurality of first gating units suitable for receiving a plurality of complementary upper-level bit signals based on the uppermost lower-level bit signal or one among the upper-level bit signals; a plurality of first inversion units suitable for inverting a plurality of first output signals outputted from the first gating units; a plurality of second inversion units suitable for inverting a plurality of first inversion signals outputted from the first inversion units and feeding back the inverted first inversion signals to the first inversion units; a plurality of second gating units suitable for selectively coupling the first inversion units and the second inversion units with each other based on an inversion signal of the uppermost lower-level bit signal or an inversion signal of one among the upper-level bit signals; a plurality of third gating units suitable for outputting the first inversion signals based on the inversion signal of the uppermost lower-level bit signal or the inversion signal of one among the upper-level bit signals; a plurality of third inversion units suitable for inverting a plurality of second output signals outputted from the third gating units and generating the upper-level bit signals; a plurality of fourth inversion units suitable for inverting the upper-level bit signals and feeding back the inverted upper-level bit signals to the third inversion units; and a plurality of fourth gating units suitable for selectively coupling the third inversion units and the fourth inversion units with each other based on the uppermost lower-level bit signal or one among the upper-level bit signals.

The upper-level bit division blocks may include a plurality of first gating units suitable for receiving a plurality of complementary upper-level bit signals based on the uppermost lower-level bit signal or one among the upper-level bit signals; a plurality of first inversion units suitable for inverting a plurality of first output signals outputted from the first gating units; a plurality of second inversion units suitable for inverting a plurality of first inversion signals outputted from the first inversion units and feeding back the inverted first inversion signals to the first inversion units based on an inversion signal of the uppermost lower-level bit signal or an inversion signal of one among the upper-level bit signals; a plurality of second gating units suitable for outputting the first inversion signals based on the inversion signal of the uppermost lower-level bit signal or the inversion signal of one among the upper-level bit signals; a plurality of third inversion units suitable for inverting a plurality of second output signals outputted from the second gating units and generating the upper-level bit signals; and a plurality of fourth inversion units suitable for inverting the upper-level bit signals and feeding back the inverted upper-level bit signals to the third inversion units based on the uppermost lower-level bit signal or one among the upper-level bit signals.

In accordance with an embodiment of the present invention, an electronic system includes: a control device suitable for generating a control signal based on an information signal corresponding to an operation frequency; and an electronic device suitable for generating a plurality of lower-level bit signals by performing a counting operation while a latch operation stops during a counting section based on the control signal or generating some of the lower-level bit signals by performing the counting operation while the latch operation stops during the counting section based on the control signal and generating the other lower-level bit signals by performing the counting operation while the latch operation selectively stops during the counting section.

The electronic device may perform the latch operation while the counting operation stops during a holding section and alternates the counting section and the holding section.

The electronic device may include a frequency detection portion suitable for generating the information signal based on a source clock signal; a logic control portion suitable for generating a hold control signal and a counting clock signal based on the source clock signal and a count enable signal; a plurality of selection portions suitable for selecting one among respectively predetermined signals including the counting clock signal or one among the lower-level bit signals and the hold control signal and generating a plurality of selection signals; and a plurality of lower-level bit division portions suitable for generating the lower-level bit signals divided at respectively predetermined division ratios as compared with the counting clock signal during the counting section and latching the lower-level bit signals during the holding section based on the counting clock signal or one among the lower-level bit signals and one among the selection signals.

The electronic device may further include a plurality of upper-level bit division portions suitable for generating the upper-level bit signals divided at respectively predetermined division ratios as compared with the counting clock signal during the counting section and latching the upper-level bit signals during the holding section based on an uppermost lower-level bit signal among the lower-level bit signals or one among the upper-level bit signals.

DETAILED DESCRIPTION

Figure 1:
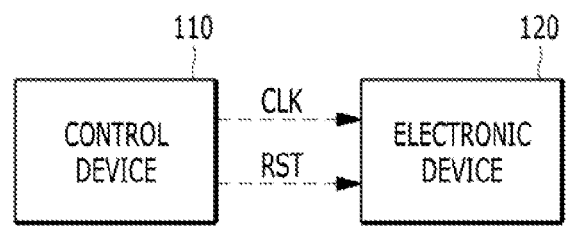
FIG. 1 is a block diagram illustrating an electronic system in accordance with an embodiment of the present invention.

Exemplary embodiments of the present invention are described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers where the first layer is formed directly on the second layer or the substrate but also to where a third layer exists between the first layer and the second layer or the substrate.

FIG. 1 is a block diagram illustrating an electronic system 100 in accordance with an embodiment of the present invention.

Referring to FIG. 1, the electronic system 100 may include a control device 110 and an electronic device 120.

The control device 110 may control general operations of the electronic device 120. The control device 110 may transmit a source clock signal CLK and an initialization signal RST. For example, the control device 110 may include a central processing unit (CPU).

The electronic device 120 may perform a predetermined operation under the control of the control device 110. For example, the electronic device 120 may include a memory device such as a dynamic random access memory (DRAM) device or an image sensing device such as a CMOS image sensor. The electronic device 120 may include a counting circuit, and hereafter the description will be focused on the counting circuit.

Figure 2:
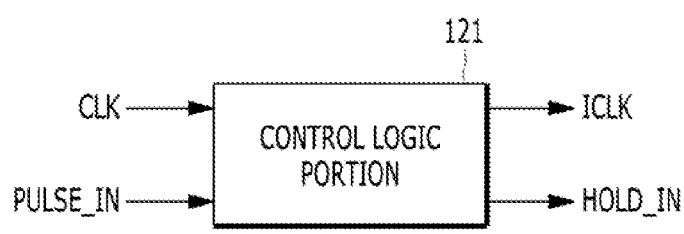
FIG. 2 is a block diagram illustrating a counting circuit in accordance with an embodiment of the present invention.
Figure 2:
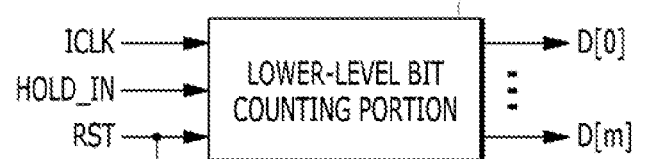
Figure 2:
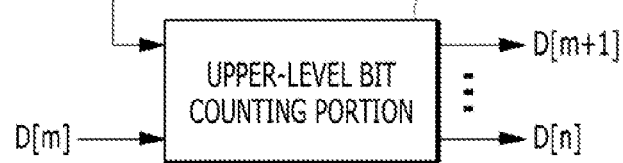

FIG. 2 is a block diagram illustrating a counting circuit 120A in accordance with an embodiment of the present invention, which may be included in the electronic device 120 shown in FIG. 1. Referring to FIG. 2, the counting circuit 120A may include a control logic portion 121, a lower-level bit counting portion 123, and an upper-level bit counting portion 125. From another point of view, the counting circuit 120A may include first and second portions. The control logic portion 121 may correspond to the first portion, and the lower-level bit counting portion 123 and the upper-level bit counting portion 125 may correspond to the second portion (i.e., a counting portion). Here, the second portion may perform a counting operation while a latch operation stops during a counting section and performs the latch operation while the counting operation stops during a holding section. Furthermore, the second portion may include a plurality of division blocks that generate a plurality of division signals divided at respectively predetermined division ratios and latch the division signals during the holding section.

The control logic portion 121 generates a hold control signal HOLD_IN and a counting clock signal ICLK in response to a count enable signal PULSE_IN and the source clock signal CLK. The lower-level bit counting portion 123 performs a counting operation while a latch operation stops during a counting section and the latch operation while the counting operation stops during a holding section in response to the hold control signal HOLD_IN, the counting clock signal ICLK and the initialization signal RST. The upper-level bit counting portion 125 performs the counting operation while the latch operation selectively stops during the counting section and the latch operation while the counting operation stops during the holding section in response to an uppermost lower-level bit signal D[m] among a plurality of lower-level bit signals D[0] to D[m] outputted from the lower-level bit counting portion 123.

Herein, the source clock signal CLK and the initialization signal RST may be external signals inputted from the control device 110 and internal signals generated inside the electronic device 120. The count enable signal PULSE_IN may be an internal signal generated inside the electronic device 120. For example, an image sensing device includes comparators that may compare a ramp signal with a pixel signal, outputted from a pixel array, and internally generate the count enable signal PULSE_IN corresponding to the comparison result.

Figure 3:
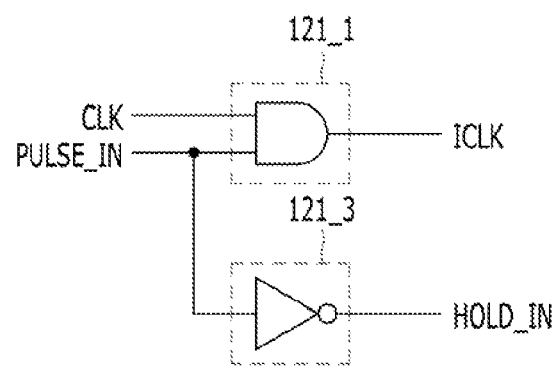
FIG. 3 is a detailed diagram of a control logic portion shown in FIG. 2.

FIG. 3 is a detailed diagram of the control logic portion 121 shown in FIG. 2.

Referring to FIG. 3, the control logic portion 121 may include a clock sampling block (or a clock gating block) 121_1 and an inversion block 121_3. The clock sampling block 121_1 generates the counting clock signal ICLK toggling during the counting section in response to the source clock signal CLK and the count enable signal PULSE_IN. The inversion block 121_3 generates the hold control signal HOLD_IN by inverting the count enable signal PULSE_IN. For example, the clock sampling block 121_1 may include an AND gate, and the inversion block 121_3 may include an inverter.

Figure 4:
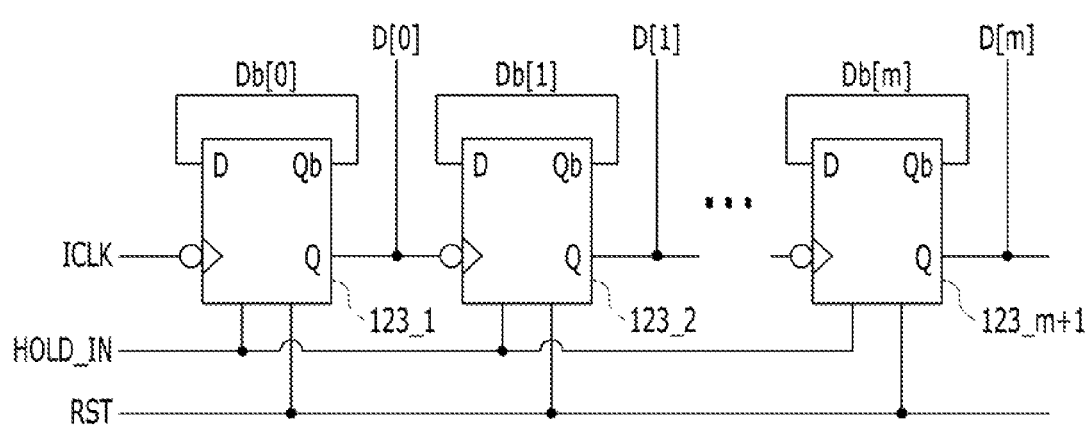
FIG. 4 is a detailed diagram of a lower-level bit counting portion shown in FIG. 2.

FIG. 4 is a detailed diagram of the lower-level bit counting portion 123 shown in FIG. 2.

Referring to FIG. 4, the lower-level bit counting portion 123 may include a plurality of lower-level bit division blocks 123_1 to 123_m+1. The lower-level bit division blocks 123_1 to 123_m+1 generate the lower-level bit signals D[0] to D[m] divided at predetermined division ratios, respectively, as compared with the counting clock signal ICLK during the counting section based on the counting clock signal ICLK or one among the lower-level bit signals D[0] to D[m] and the hold control signal HOLD_IN and latch the lower-level bit signals D[0] to D[m] during the holding section.

For example, the lower-level bit division blocks 123_1 to 123_m+1 may be coupled with each other in series and include D-flip flops, individually. The first lower-level bit division block 123_1 among the lower-level bit division blocks 123_1 to 123_m+1 may divide the counting clock signal ICLK by 2 and output the divided counting clock signal ICLK, and the other lower-level bit division blocks 123_2 to 123_m+1 among the lower-level bit division blocks 123_1 to 123_m+1 may divide the lower-level bit signals D[0] to D[m−1] outputted from the former lower-level bit division blocks 123_1 to 123_m by 2 and output the divided lower-level bit signals D[0] to D[m−1]. As a result, the first lower-level bit signal D[0] may be a division signal divided by 2 as compared with the counting clock signal ICLK, and the second lower-level bit signal D[1] may be a division signal divided by 4 as compared with the counting clock signal ICLK, and the third lower-level bit signal D[2] may be a division signal divided by 8 as compared with the counting clock signal ICLK. Since the other lower-level bit signals D[3] to D[m] are predictable, detailed descriptions thereon are omitted herein.

Figure 5A:
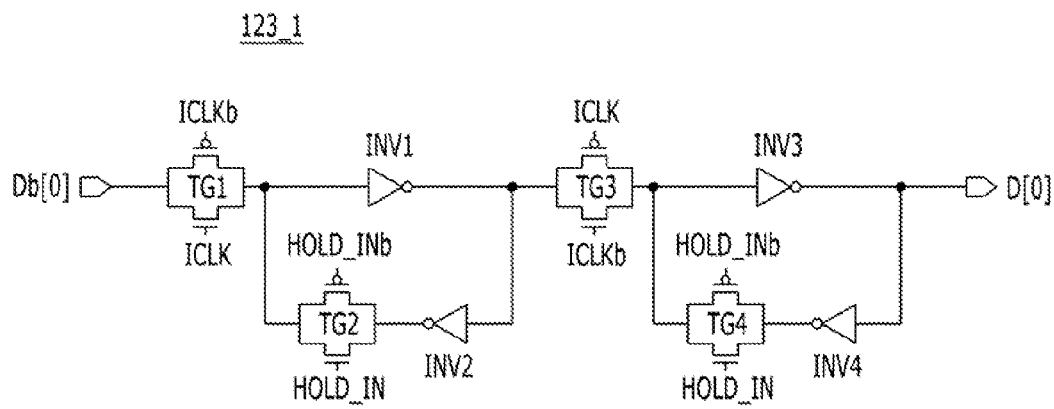
FIGS. 5A and 5B are detailed diagrams of a portion of a first lower-level bit division block shown in FIG. 4.
Figure 5B:
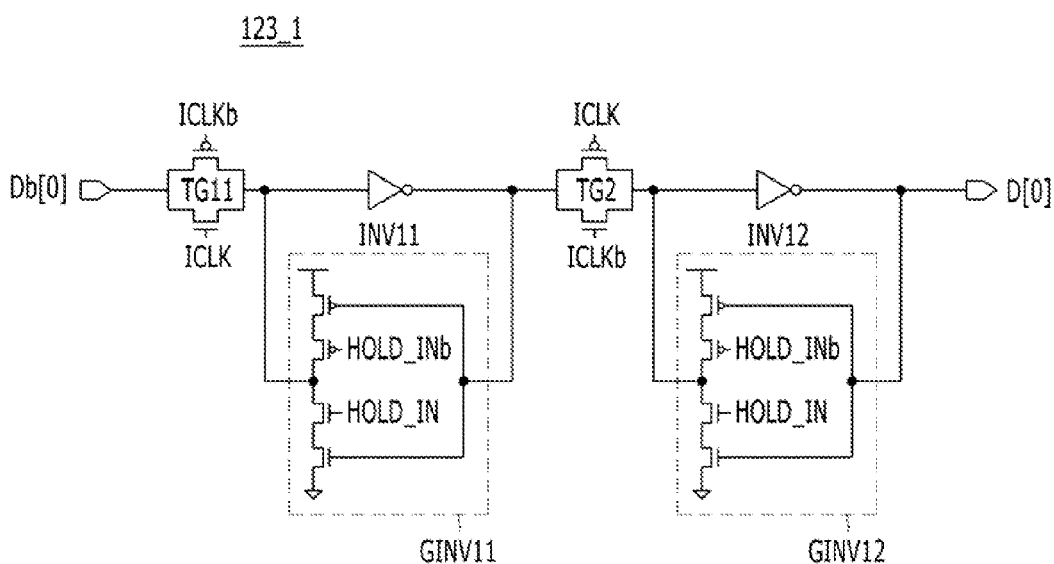

FIGS. 5A and 5B are detailed diagrams of a portion of the first lower-level bit division block 123_1 shown in FIG. 4.

Referring to FIG. 5A, the first lower-level bit division block 123_1 may include a first gating unit TG1, a first inversion unit INV1, a second inversion unit INV2, a second gating unit TG2, a third gating unit TG3, a third inversion unit INV3, a fourth inversion unit INV4, and a fourth gating unit TG4. The first gating unit TG1 receives a complementary first lower-level bit signal Db[0], which is in an inverse relationship with the first lower-level bit signal D[0], based on the counting clock signal ICLK. The first inversion unit INV1 inverts a first output signal outputted from the first gating unit TG1. The second inversion unit INV2 inverts a first inversion signal outputted from the first inversion unit INV1 and feeds back the inverted first inversion signal to the first inversion unit INV1. The second gating unit TG2 selectively couples the first inversion unit INV1 and the second inversion unit INV2 with each other based on the hold control signal HOLD_IN. The third gating unit TG3 outputs the first inversion signal based on a complementary counting clock signal ICLKb, which is an inversion signal of the counting clock signal ICLK. The third inversion unit INV3 inverts a second output signal outputted from the third gating unit TG3 and generates the first lower-level bit signal D[0]. The fourth inversion unit INV4 inverts the first lower-level bit signal D[0] and feeds back the inverted first lower-level bit signal D[0] to the third inversion unit INV3. The fourth gating unit TG4 selectively couples the third inversion unit INV3 and the fourth inversion unit INV4 with each other based on the hold control signal HOLD_IN.

Herein, the second gating unit TG2 may be formed between an input terminal of the first inversion unit INV1 and an output terminal of the second inversion unit INV2. The second gating unit TG2 may continuously decouple the input terminal of the first inversion unit INV1 from the output terminal of the second inversion unit INV2 during the counting section and continuously couple the input terminal of the first inversion unit INV1 with the output terminal of the second inversion unit INV2 during the holding section.

The first inversion unit INV1 and the second inversion unit INV2 may be electrically decoupled from each other by the second gating unit TG2 during the counting section. Then, a latch operation performed by the first inversion unit INV1 and the second inversion unit INV2 may stop. Also, the first inversion unit INV1 and the second inversion unit INV2 may be electrically coupled with each other by the second gating unit TG2 during the holding section. Then, the latch operation may be performed by the first inversion unit INV1 and the second inversion unit INV2.

The fourth gating unit TG4 may be formed between an input terminal of the third inversion unit INV3 and an output terminal of the fourth inversion unit INV4. The fourth gating unit TG4 may electrically decouple the input terminal of the third inversion unit INV3 from the output terminal of the fourth inversion unit INV4 during the counting section and electrically couple the input terminal of the third inversion unit INV3 with the output terminal of the fourth inversion unit INV4 during the holding section.

The third inversion unit INV3 and the fourth inversion unit INV4 may be electrically decoupled from each other by the fourth gating unit TG4 during the counting section. Then, a latch operation performed by the third inversion unit INV3 and the fourth inversion unit INV4 may stop. Also, the third inversion unit INV3 and the fourth inversion unit INV4 may be electrically coupled with each other by the fourth gating unit TG4 during the holding section. Then, the latch operation may be performed by the third inversion unit INV3 and the fourth inversion unit INV4.

Herein, the complementary first lower-level bit signal Db[0] may include the second output signal outputted from the third gating unit TG3 or a inverted signal of the first lower-level bit signal D[0].

Since the other lower-level bit division blocks 123_2 to 123_$m$+1, except for the first lower-level bit division block 123_1, among the lower-level bit division blocks 123_1 to 123_$m$+1 may have the same structure as the first lower-level bit division block 123_1, a detailed description thereon is omitted herein. However, the other lower-level bit division blocks 123_2 to 123_$m$+1 may receive the lower-level bit signals D[0] to D[m−1] outputted from the former lower-level bit division blocks 123_1 to 123_$m$ instead of the counting clock signal ICLK, respectively.

Referring to FIG. 5B, the first lower-level bit division block 123_1 may include a first gating unit TG11, a first inversion unit INV11, a first gated inversion unit GINV11, a second gating unit TG12, a second inversion unit INV12, and a second gated inversion unit GINV12. The first gating unit TG11 receives a complementary first lower-level bit signal Db[0], which is in an inverse relationship with the first lower-level bit signal D[0], based on the counting clock signal ICLK. The first inversion unit INV11 inverts a first output signal outputted from the first gating unit TG11. The first gated inversion unit GINV11 inverts a first inversion signal outputted from the first inversion unit INV11 based on the hold control signal HOLD_IN and feeds back the inverted first inversion signal to the first inversion unit INV11. The second gating unit TG12 outputs the first inversion signal based on a complementary counting clock signal ICLKb which is an inversion signal of the counting clock signal ICLK. The second inversion unit INV12 inverts a second output signal outputted from the second gating unit TG12 and generates the first lower-level bit signal D[0]. The second gated inversion unit GINV12 inverts the first lower-level bit signal D[0] based on the hold control signal HOLD_IN and feeds back the inverted first lower-level bit signal D[0] to the second inversion unit INV12.

Herein, the first and second gated inversion units GINV11 and GINV12 may be disabled during the counting section and enabled during the holding section based on the hold control signal HOLD_IN. For example, each of the first and second gated inversion units GINV11 and GINV12 may include a gated inverter that is controlled based on the hold control signal HOLD_IN.

Herein, the complementary first lower-level bit signal Db[0] may include the second output signal outputted from the second gating unit TG12 or a inverted signal of the first lower-level bit signal D[0].

Since the other lower-level bit division blocks 123_2 to 123_$m$+1, except for the first lower-level bit division block 123_1, among the lower-level bit division blocks 123_1 to 123_$m$+1 may have the same structure as the first lower-level bit division block 123_1, a detailed description thereon is omitted herein. However, the other lower-level bit division blocks 123_2 to 123_$m$+1 may receive the lower-level bit signals D[0] to D[m−1] outputted from the former lower-level bit division blocks 123_1 to 123_$m$ instead of the counting clock signal ICLK, respectively.

Figure 6:
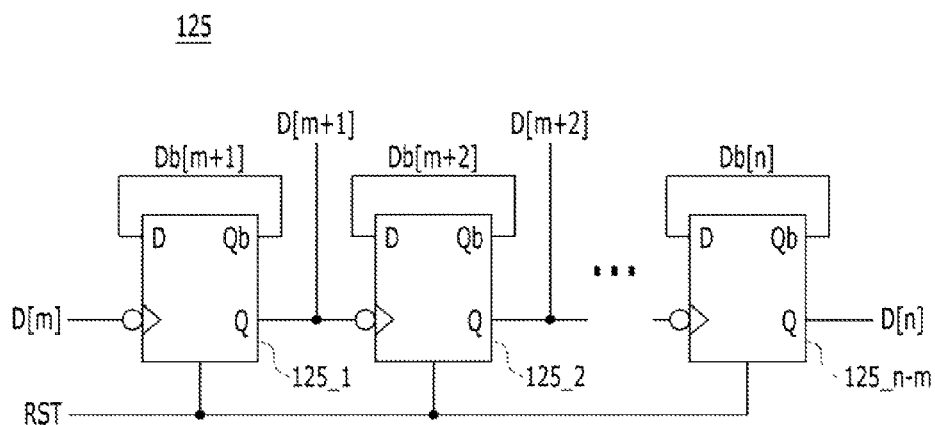
FIG. 6 is a detailed diagram of an upper-level bit counting portion shown in FIG. 2.

FIG. 6 is a detailed diagram of the upper-level bit counting portion 125 shown in FIG. 2.

Referring to FIG. 6, the upper-level bit counting portion 125 may include a plurality of upper-level bit division blocks 125_1 to 125_$n$−$m$. The upper-level bit division blocks 125_1 to 125_$n$−$m$ generate a plurality of upper-level bit signals D[m+1] to D[n] divided at predetermined division ratios, respectively, as compared with the uppermost lower-level bit signal D[m] during the counting section and latch the upper-level bit signals D[m+1] to D[n] during the holding section based on the uppermost lower-level bit signal D[m] among the lower-level bit signals D[0] to D[m] or one among the upper-level bit signals D[m+1] to D[n].

For example, the upper-level bit division blocks 125_1 to 125_$n$−$m$ may be coupled with each other in series and include a D-flip flop, respectively. The first upper-level bit division block 125_1 among the upper-level bit division blocks 125_1 to 125_$n$−$m$ may divide the uppermost lower-level bit signal D[m] by 2 and output the divided uppermost lower-level bit signal D[m], and the other upper-level bit division blocks 125_2 to 125_$n$−$m$ among the upper-level bit division blocks 125_1 to 125_$n$−$m$ may divide the upper-level bit signals D[m+1] to D[n−1] outputted from the former upper-level bit division blocks 125_1 to 125_$n$−$m$−1 by 2 and output the divided upper-level bit signals D[m+1] to D[n−1]. As a result, the first upper-level bit signal D[m+1] may be a division signal divided by 2 as compared with the uppermost lower-level bit signal D[m], and the second upper-level bit signal D[m+2] may be a division signal divided by 4 as compared with the uppermost lower-level bit signal D[m], and the third upper-level bi signal D[m+3] may be a division signal divided by 8 as compared with the uppermost lower-level bit signal D[m]. Since the other upper-level bit signals D[m+4] to D[n] are predictable, a detailed description thereon is omitted herein.

Figure 7A:
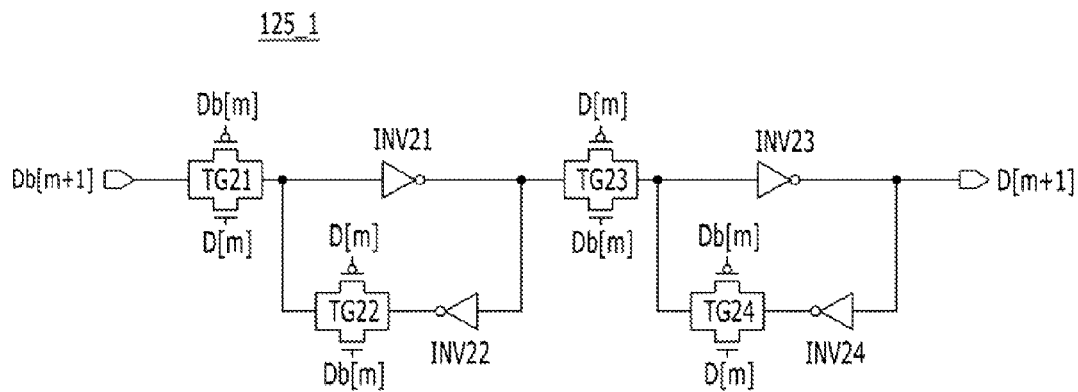
FIGS. 7A and 7B are detailed diagrams of a portion of a first upper-level bit division block shown in FIG. 6.
Figure 7B:
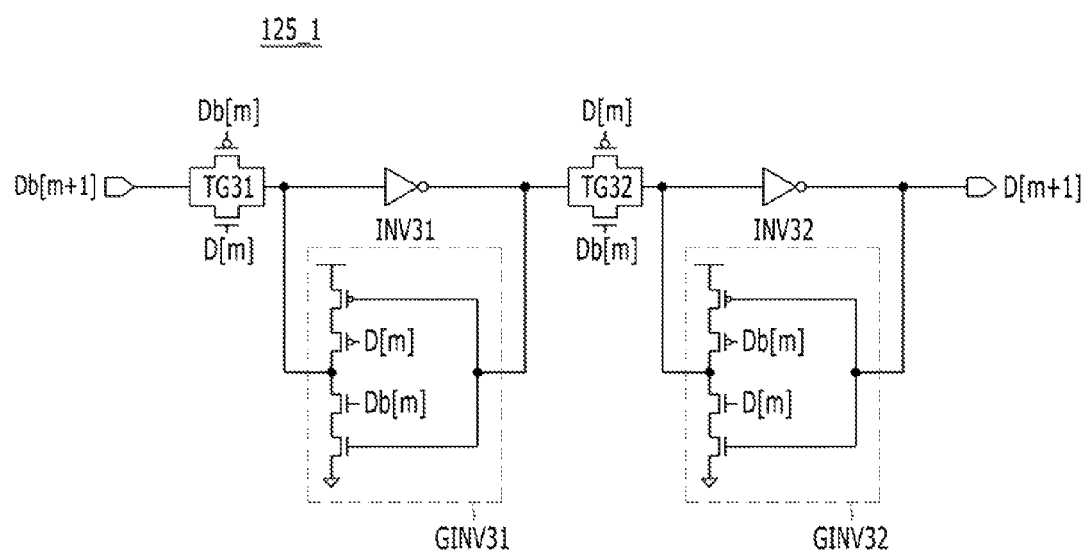

FIGS. 7A and 7B are detailed diagrams of a portion of the first upper-level bit division block 125_1 shown in FIG. 6.

Referring to FIG. 7A, the first upper-level bit division block 125_1 may include a first gating unit TG21, a first inversion unit INV21, a second inversion unit INV22, a second gating unit TG22, a third gating unit TG23, a third inversion unit INV23, a fourth inversion unit INV24, and a fourth gating unit TG24. The first gating unit TG21 receives a complementary first upper-level bit signal Db[m+1], which is in an inverse relationship with the first upper-level bit signal D[m+1], based on the uppermost lower-level bit signal D[m]. The first inversion unit INV21 inverts a first output signal outputted from the first gating unit TG21. The second inversion unit INV22 inverts a first inversion signal outputted from the first inversion unit INV21 and feeds back the inverted first inversion signal to the first inversion unit INV21. The second gating unit TG2 selectively couples the first inversion unit INV21 and the second inversion unit INV22 with each other based on a complementary uppermost lower-level bit signal Db[m], which is in inverse relationship with the uppermost lower-level bit signal D[m]. The third gating unit TG23 outputs the first inversion signal based on the complementary uppermost lower-level bit signal Db[m]. The third inversion unit INV23 inverts a second output signal outputted from the third gating unit TG23 and generates the first upper-level bit signal D[m+1]. The fourth inversion unit INV24 inverts the first upper-level bit signal D[m+1] and feeds back the inverted first upper-level bit signal D[m+1] to the third inversion unit INV23. The fourth gating unit TG24 selectively couples the third inversion unit INV23 and the fourth inversion unit INV24 with each other based on the uppermost lower-level bit signal D[m].

Herein, the second gating unit TG22 may be formed between an input terminal of the first inversion unit INV21 and an output terminal of the second inversion unit INV22. The second gating unit TG22 may selectively couple the input terminal of the first inversion unit INV21 with the output terminal of the second inversion unit INV22 during the counting section and continuously couple the input terminal of the first inversion unit INV21 with the output terminal of the second inversion unit INV22 during the holding section.

The first inversion unit INV21 and the second inversion unit INV22 may be selectively coupled with each other by the second gating unit TG22 during the counting section. Then, a latch operation performed by the first inversion unit INV21 and the second inversion unit INV22 may repeatedly stop and be performed during the counting section. Also, the first inversion unit INV21 and the second inversion unit INV22 may be continuously coupled with each other by the second gating unit TG22 during the holding section. Then, the latch operation may be continuously performed by the first inversion unit INV21 and the second inversion unit INV22 during the holding section.

The fourth gating unit TG24 may be formed between an input terminal of the third inversion unit INV23 and an output terminal of the fourth inversion unit INV24. The fourth gating unit TG24 may selectively couple the input terminal of the third inversion unit INV23 with the output terminal of the fourth inversion unit INV24 during the counting section and continuously decouple the input terminal of the third inversion unit INV23 from the output terminal of the fourth inversion unit INV24 during the holding section.

The third inversion unit INV23 and the fourth inversion unit INV24 may be selectively coupled with each other by the fourth gating unit TG24 during the counting section. Then, a latch operation performed by the third inversion unit INV23 and the fourth inversion unit INV24 may repeatedly stop and be performed during the counting section. Also, the third inversion unit INV23 and the fourth inversion unit INV24 may be continuously decoupled from each other by the fourth gating unit TG24 during the holding section. Then, the latch operation by the third inversion unit INV23 and the fourth inversion unit INV24 may continuously stop during the holding section.

Herein, the complementary first upper-level bit signal Db[m+1] may include the second output signal outputted from the third gating unit TG23 or a inverted signal of the first upper-level bit signal D[m+1].

Since the other upper-level bit division blocks 125_2 to 125_n–m, except for the first upper-level bit division block 125_1, among the upper-level bit division blocks 125_1 to 125_m may have the same structure as the first upper-level bit division block 125_1, a detailed description thereon is omitted herein. However, the other upper-level bit division blocks 125_2 to 125_n–m may receive the upper-level bit signals D[m+1] to D[n−1] outputted from the former upper-level bit division blocks 125_1 to 125_n–m instead of the uppermost lower-level bit signal D[m], respectively.

Referring to FIG. 7B, the first upper-level bit division block 125_1 may include a first gating unit TG31, a first inversion unit INV31, a first gated inversion unit GINV31, a second gating unit TG32, a second inversion unit INV32, and a second gated inversion unit GINV32. The first gating unit TG31 receives a complementary first upper-level bit signal Db[m+1] based on the uppermost lower-level bit signal D[m]. The first inversion unit INV31 inverts a first output signal outputted from the first gating unit TG31. The first gated inversion unit GINV31 inverts a first inversion signal outputted from the first inversion unit INV31 based on the complementary uppermost lower-level bit signal Db[m] and feeds back the inverted first inversion signal to the first inversion unit INV31. The second gating unit TG32 outputs the first inversion signal based on the complementary uppermost lower-level bit signal Db[m]. The second inversion unit INV32 inverts a second output signal outputted from the second gating unit TG32 and generates the first upper-level bit signal D[m+1]. The second gated inversion unit GINV32 inverts the first upper-level bit signal D[m+1] based on the uppermost lower-level bit signal D[m] and feeds back the inverted first upper-level bit signal D[m+1] to the second inversion unit INV32.

The first gated inversion unit GINV31 may be repeatedly disabled and enabled during the counting section and continuously enabled during the holding section based on the complementary uppermost lower-level bit signal Db[m]. The second gated inversion unit GINV32 may be repeatedly disabled and enabled during the counting section and continuously disabled during the holding section based on the uppermost lower-level bit signal D[m]. The first and second gated inversion units GINV31 and GINV32 may be reversely disabled and enabled during the counting section.

For example, each of the first and second gated inversion units GINV31 and GINV32 may include a gated inverter that is controlled based on the uppermost lower-level bit signal D[m] and/or the complementary uppermost lower-level bit signal Db[m].

Herein, the complementary first upper-level bit signal Db[m+1] may include the second output signal outputted from the second gating unit TG32 or a inverted signal of the first upper-level bit signal D[m+1].

Since the other upper-level bit division blocks 125_2 to 125_n–m except for the first upper-level bit division block 125_1 among the upper-level bit division blocks 125_1 to 125_m may have the same structure as the first upper-level bit division block 125_1, a detailed description thereon is omitted herein. However, the other upper-level bit division blocks 125_2 to 125_n–m may receive the upper-level bit signals D[m+1] to D[n−1] outputted from the former upper-level bit division blocks 125_1 to 125_n–m instead of the uppermost lower-level bit signal D[m], respectively.

Figure 8:
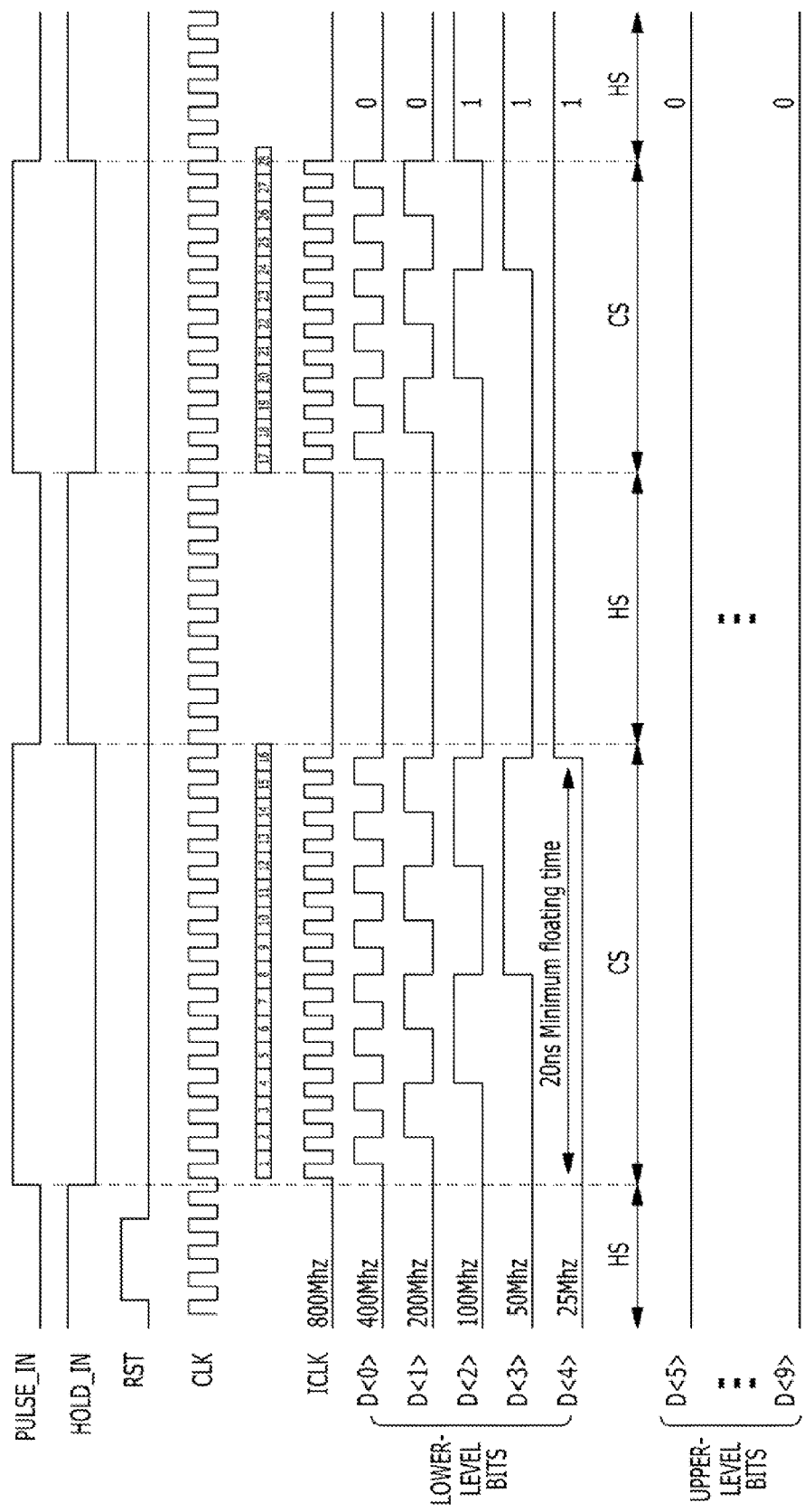
FIG. 8 is a timing diagram for describing an operation of the counting circuit shown in FIG. 2.

FIG. 8 is a timing diagram for describing the operation of the counting circuit 121A shown in FIG. 1.

For the sake of convenience in description, the lower-level bit signals D[0] to D[m] are described as first to fifth lower-level bit signals D[0] to D[4], and the upper-level bit signals D[m+1] to D[n] are described as first to fifth upper-level bit signals D[5] to D[9].

Referring to FIG. 8, the control logic portion 121 may generate the hold control signal HOLD_IN and the counting clock signal ICLK in response to the count enable signal PULSE_IN and the source clock signal CLK. For example, the control logic portion 121 may generate the hold control signal HOLD_IN by inverting the count enable signal PULSE_IN, and generate the counting clock signal ICLK by performing an AND operation on the count enable signal PULSE_IN and the source clock signal CLK. The counting clock signal ICLK may be fixed with a logic low level during a holding section HS where the count enable signal PULSE_IN is deactivated to a logic low level, and the counting clock signal ICLK may toggle and correspond to the source clock signal CLK during a counting section CS where the count enable signal PULSE_IN is activated to a logic high level.

The lower-level bit counting portion 123 and the upper-level bit counting portion 125 may be initialized in response to the initialization signal RST. For example, when the initialization signal RST is activated to a logic high level, the lower-level bit counting portion 123 may initialize the first to fifth lower-level bit signals D[0] to D[4] to a logic low level, and the upper-level bit counting portion 125 may initialize the first to fifth upper-level bit signals D[5] to D[9] to a logic low level. The first lower-level bit signal D[0] may be a least significant bit (LSB), and the fifth upper-level bit signal D[9] may be a most significant bit (MSB).

Under the above condition, when entering the counting section CS, the lower-level bit counting portion 123 may divide the counting clock signal ICLK to generate the first to fifth lower-level bit signals D[0] to D[4]. For example, the first lower-level bit division block 123_1 may divide the counting clock signal ICLK by 2 to generate the first lower-level bit signal D[0], and the second lower-level bit division block 123_2 may divide the first lower-level bit signal D[0] by 2 to generate the second lower-level bit signal D[1], the third lower-level bit division block 123_3 may divide the second lower-level bit signal D[1] by 2 to generate the third lower-level bit signal D[2], and the fourth lower-level bit division block 123_4 may divide the third lower-level bit signal D[2] by 2 to generate the fourth lower-level bit signal D[3], and the fifth lower-level bit division block 123_5 may divide the fourth lower-level bit signal D[3] by 2 to generate the fifth lower-level bit signal D[4].

The first to fifth lower-level bit division block 123_1 to 123_5 may generate the first to fifth lower-level bit signals D[0] to D[4] while the latch operation selectively stops during the counting section CS based on the hold control signal HOLD_IN.

For example, referring to FIG. 5A, since the second and fourth gating unit TG2 and TG4, each included in the first to fifth lower-level bit division block 123_1 to 123_5, may be disabled during the counting section CS, and then feedback paths each including the second and fourth inversion units INV2 and INV4 may electrically open, the latch operation by the first and second inversion units INV1 and INV2 and the latch operation by the third and fourth inversion units INV3 and INV4 may stop.

The first to fifth lower-level bit signals D[0] to D[4] may be generated although the latch operation stops since the floating state of latch nodes including the input terminals of the first and third inversion units INV1 and INV3 may be ignored as the signals for controlling the first and third gating units TG1 and TG3, including the counting clock signal ICLK and the first to fourth lower-level bit signals D[0] to D[3], have high frequencies. For example, when the minimum floating time when the floating state may be ignored is approximately 20 ns, and the frequency of the counting clock signal ICLK is approximately 800 Mhz, the high frequency range may be from the counting clock signal ICLK, whose frequency is approximately 800 Mhz, to the fourth lower-level bit signal D[3], whose frequency is approximately 50 Mhz.

Therefore, since the lower-level bit counting portion 123 may stop performing the latch operation during counting section CS, the loading time taken for the latch operation and power consumption may be reduced.

Although not illustrated in the drawing, the upper-level bit counting portion 125 may divide the fifth lower-level bit signal D[4] to generate the first to fifth upper-level bit signals D[5] to D[9]. For example, the first upper-level bit division block 125_1 may divide the fifth lower-level bit signal D[4] by 2 to generate the first upper-level bit signal D[5], and the second upper-level bit division block 125_2 may divide the first upper-level bit signal D[5] by 2 to generate the second upper-level bit signal D[6], and the third upper-level bit division block 125_3 may divide the second upper-level bit signal D[6] by 2 to generate the third upper-level bit signal D[7], and the fourth upper-level bit division block 125_4 may divide the third upper-level bit signal D[7] by 2 to generate the fourth upper-level bit signal D[8], and the fifth upper-level bit division block 125_5 may divide the fourth upper-level bit signal D[8] by 2 to generate the fifth upper-level bit signal D[9].

The first to fifth upper-level bit division blocks 125_1 to 125_5 may generate the first to fifth upper-level bit signals D[5] to D[9] while the latch operation selectively stops during the counting section CS based on the fifth lower-level bit signal D[4] or one among the first to fourth upper-level bit signals D[5] to D[8].

For example, referring to FIG. 7A, since the second and fourth gating units TG22 and TG24, each included in the first to fifth upper-level bit division blocks 125_1 to 125_5, may be repeatedly disabled and enabled during the counting section CS, and then feedback paths each including the second and fourth inversion units INV22 and INV4 may repeatedly open and be closed, the latch operation by the first and second inversion units INV21 and INV22 and the latch operation by the third and fourth inversion units INV23 and INV24 may selectively stop. In other words, when the first gating unit TG21 is enabled, and the third gating unit TG23 is disabled, the latch operations by the first and second inversion units INV21 and INV22 may stop while the second gating unit TG22 is disabled, and simultaneously the latch operations by the third and fourth inversion units INV23 and INV24 may be performed while the fourth gating unit TG24 is enabled. In contrast, when the first gating unit TG21 is disabled, and the third gating unit TG23 is enabled, the latch operations by the first and second inversion units INV21 and INV22 may be performed while the second gating unit TG22 is enabled, and simultaneously the latch operations by the third and fourth inversion units INV23 and INV24 may stop while the fourth gating unit TG24 is disabled.

The reason why the latch operation of the first to fifth upper-level bit division blocks 125_1 to 125_5 may selectively stop and be performed during the counting section CS is to avoid the floating state of latch nodes including the input terminals of the first and third inversion units INV21 and INV23 as signals for controlling the first and third gating units TG21 and TG23 including the fifth lower-level bit signal D[4] and the first to fourth upper-level bit signal D[5] to D[8] have low frequencies. For example, when the minimum floating time when the floating state may be ignored is approximately 20 ns, and the frequency of the counting clock signal ICLK is approximately 800 Mhz, the range of the low frequency may be from the fifth lower-level bit signal D[4], whose frequency is approximately 25 Mhz or less, to the fifth upper-level bit signal D[9].

Subsequently, when entering the holding section HS, the lower-level bit counting portion 123 may perform a latch operation during the holding section HS based on the hold control signal HOLD_IN. In other words, the first to fifth lower-level bit division blocks 123_1 to 123_5 may latch the first to fifth lower-level bit signals D[0] to D[4] during the holding section HS. Also, the upper-level bit counting portion 125 may perform a latch operation during the holding section HS based on the fifth lower-level bit signal D[4] and the first to fourth upper-level bit signals D[5] to D[8]. In other words, the first to fifth upper-level bit division blocks 125_1 to 125_5 may latch the first to fifth upper-level bit signals D[5] to D[9] during the holding section HS.

The first to fifth lower-level bit signals D[0] to D[4] and the first to fifth upper-level bit signals D[5] to D[9] latched during the holding section HS may by accumulatively counted during a next counting section CS. Since the next counting section CS and a next holding section HS operate in the same manner as the previous counting section CS, a detailed description thereon is omitted herein.

In accordance with the embodiments of the present invention as described above, there are advantages in that loading time and power consumption may be reduced by stopping the latch operation during the counting section, and accumulative counting may be performed by a latch operation during the holding section.

Figure 9:
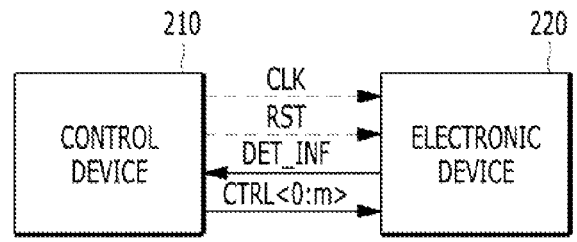
FIG. 9 is a block diagram illustrating an electronic system in accordance with an embodiment of the present invention.

FIG. 9 is a block diagram illustrating an electronic system 200 in accordance with an embodiment of the present invention.

In this embodiment of the present invention, the number of division blocks where a latch operation stops during a counting section may be controlled based on operation frequency.

In this embodiment, the structure related to a counting circuit is described as in the embodiment of FIG. 1, and the same reference numerals for the same signals described in the embodiment of FIG. 1 are used.

Referring to FIG. 9, the electronic system 200 may include a control device 210 and an electronic device 220.

The control device 210 may generate number control signals CTRL<0:m> in response to an information signal DET_INF corresponding to an operation frequency.

The electronic device 220 may generate the information signal DET_INF in response to a source clock signal CLK and perform a counting operation in response to the number control signals CTRL<0:m>.

Figure 10:
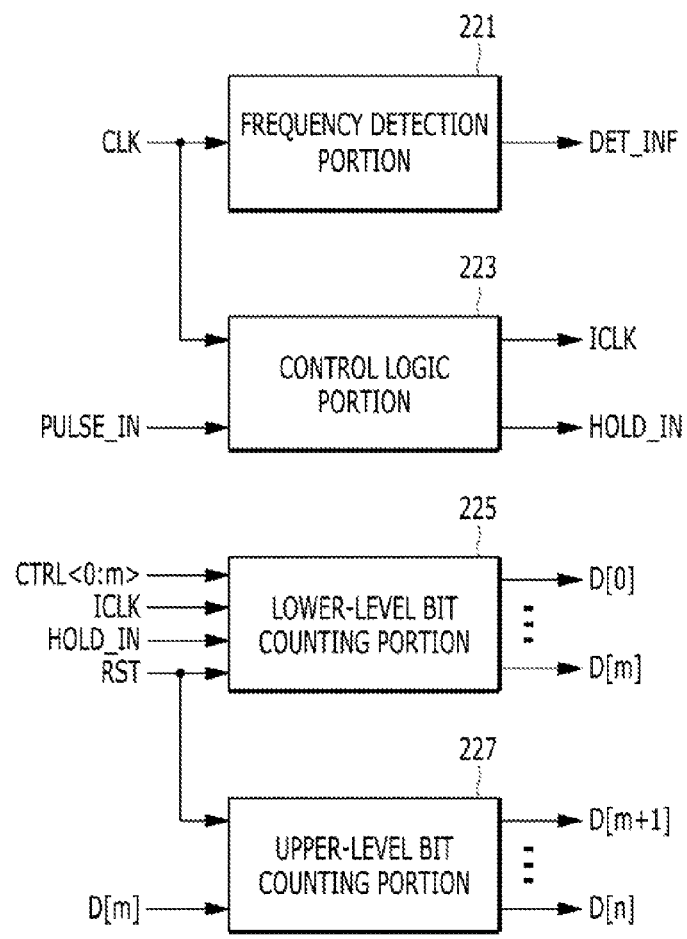
FIG. 10 is a block diagram illustrating a counting circuit in accordance with an embodiment of the present invention.

FIG. 10 is a detailed diagram illustrating a counting circuit 220A in accordance with an embodiment of the present invention, which may be included in the electronic device 220 shown in FIG. 9.

Referring to FIG. 10, the counting circuit 220A may include a frequency detection portion 221, a control logic portion 223, a lower-level bit counting portion 225, and an upper-level bit counting portion 227. The frequency detection portion 221 detects a frequency of the source clock signal CLK and generates the information signal DET_INF corresponding to the detection result. The control logic portion 223 generates a hold control signal HOLD_IN and a counting clock signal ICLK in response to the source clock signal CLK and a count enable signal PULSE_IN. The lower-level bit counting portion 225 generates a plurality of lower-level bit signals D[0] to D[m] in response to the number control signals CTRL<0:m>, the hold control signal HOLD_IN, the counting clock signal ICLK and an initialization signal RST. The upper-level bit counting portion 227 generates a plurality of upper-level bit signals D[m+1] to D[n] in response to the initialization signal RST and the uppermost lower-level bit signal D[m] among the lower-level bit signals D[0] to D[m].

Since the frequency detection portion 221 is widely known to those skilled in the art, and the control logic portion 223 and the upper-level bit counting portion 227 have the same structures as the control logic portion 121 and the upper-level bit counting portion 125 described in the embodiment of FIG. 1, a detailed description on the frequency detection portion 221, the control logic portion 223 and the upper-level bit counting portion 227 is omitted herein. The lower-level bit counting portion 225 is described hereafter.

Figure 11:
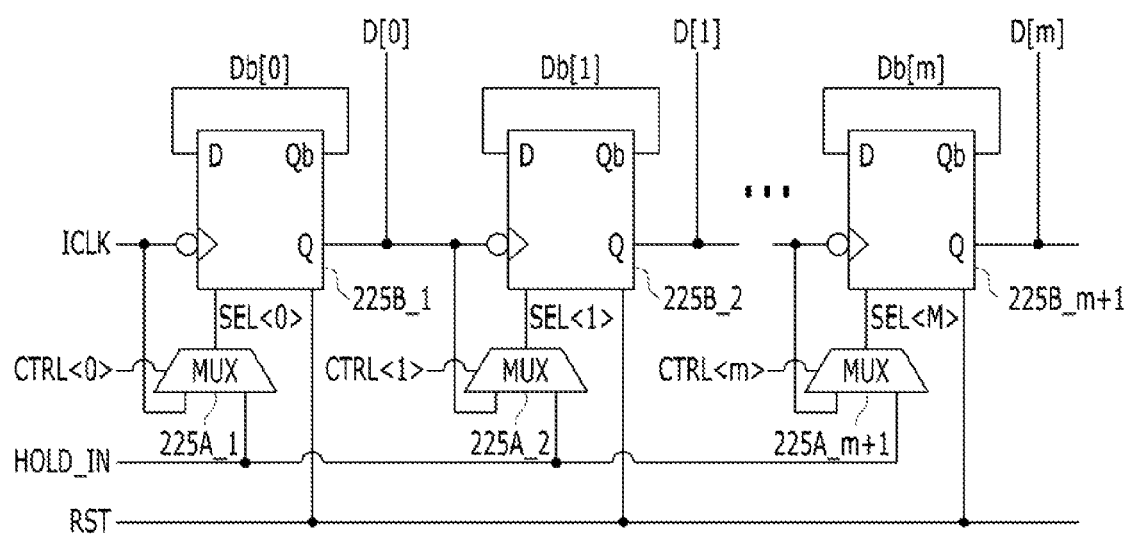
FIG. 11 is a detailed diagram of a lower-level bit counting portion shown in FIG. 10.

FIG. 11 is a circuit diagram Illustrating the lower-level bit counting portion 225 shown in FIG. 10.

Referring to FIG. 11, the lower-level bit counting portion 225 may include a plurality of selection blocks 225A_1 to 225A_m+1 and a plurality of lower-level bit division blocks 225B_1 to 225B_m+1. The selection blocks 225A_1 to 225A_m+1 select one among respectively predetermined signals including one among the lower-level bit signals D[0] to D[m] or the counting clock signal ICLK and the hold control signal HOLD_IN and output the selected signal as a plurality of selection signals SEL<0:m> in response to the number control signals CTRL<0:m>. The lower-level bit division blocks 225B_1 to 225B_m+1 generate the lower-level bit signals D[0] to D[m] divided at respectively predetermined division ratios as compared with the counting clock signal ICLK during a counting section and latch the lower-level bit signals D[0] to D[m] during a holding section based on one among the selection signals SEL<0:m> and the predetermined signals.

For example, the selection blocks 225A_1 to 225A_m+1 may include a multiplexer MUX, individually, and the lower-level bit division blocks 225B_1 to 225B_m+1 may include a D-flip flop, individually. Since the selection blocks 225A_1 to 225A_m+1 are widely known to those skilled in the art, and the lower-level bit division blocks 225B_1 to 225B_m+1 have the same structure as the lower-level bit division blocks 123_1 to 123_m+1 described in the embodiment of FIG. 1, a detailed description on the selection blocks 225A_1 to 225A_m+1 and the lower-level bit division blocks 225B_1 to 225B_m+1 is omitted herein. However, the lower-level bit division blocks 225B_1 to 225B_m+1 may receive the selection signals SEL<0:m> instead of the hold control signal HOLD_IN.

Although not Illustrated in the drawing, the lower-level bit division blocks 225B_1 to 225B_m+1 may receive the selection signals SEL<0:m> or inversion signals of the selection signals SEL<0:m> based on the number control signals CTRL<0:m>.

Hereafter, an operation of the electronic system 200 having the aforementioned structure in accordance with the embodiment of the present invention is described.

In this embodiment, it is described as in the embodiment of FIG. 1 that the first to fifth lower-level bit signals D[0] to D[4] and the first to fifth upper-level bit signals D[5] to D[9] are generated.

The electronic device 220 may detect a frequency of the source clock signal CLK, generate the information signal DET_INF corresponding to the detection result, and provide the control device 210 with the information signal DET_INF. The control device 210 may generate the number control signals CTRL<0:m> corresponding to the information signal DET_INF and provide the electronic device 220 with the number control signals CTRL<0:m>.

Thus, the counting circuit 220A may control the number of the lower-level bit division blocks where the latch operation stops during the counting section among the first to fifth lower-level bit division blocks 2258_1 to 225B_5 in response to the number control signals CTRL<0:m>. For example, when the frequency of the source clock signal CLK is approximately 800 Mhz, the first to fifth lower-level bit division blocks 225B_1 to 225B_5 may receive the first to fifth selection signals SEL<0:4> corresponding to the hold control signal HOLD_IN. Then, the first to fifth lower-level bit division blocks 225B_1 to 225B_5 may perform a counting operation while the latch operation stops during the counting section. When the frequency of the source clock signal CLK is approximately 400 Mhz, the first to fourth lower-level bit division blocks 225B_1 to 225B_4 may receive the first to fourth selection signals SEL<0:3> corresponding to the hold control signal HOLD_IN and the fifth selection signal SEL<4> corresponding to the fourth lower-level bit signal D[3]. Then, the first to fourth lower-level bit division blocks 2255_1 to 225B_4 may perform the counting operation while the latch operation stops during the counting section, and the fifth lower-level bit division block 225B_5 may perform the counting operation while the latch operation selectively stops during the counting section.

Under these circumstances, the counting circuit 220A may perform the counting operation. Since the counting operation is the same as shown in the embodiment of FIG. 1, a detailed description thereon is omitted herein (refer to FIG. 8). However, the lower-level bit counting portion 225 may generate the first to fifth lower-level bit signals D[0] to D[4] by performing the counting operation while the latch operation stops during the counting section CS or generate some signals among the first to fifth lower-level bit signals D[0] to D[4] by performing the counting operation while the latch operation stops during the counting section CS and generate the other signals among the first to fifth lower-level bit signals D[0] to D[4] by performing the counting operation while the latch operation selectively stops during the counting section CS in response to the number control signals CTRL<0:m>. For example, when the first to fifth number control signals CTRL<0:4> are enabled, the lower-level bit counting portion 225 may generate the first to fifth lower-level bit signals D[0] to D[4] by performing the counting operation while the latch operation stops during the counting section CS. When the first to fourth number control signals CTRL<0:3> are enabled, and the fifth number control signal CTRL<4> is disabled, the lower-level bit counting portion 225 may generate the first to fourth lower-level bit signals D[0] to D[3] by the performing the counting operation while the latch operation stops during the counting section CS and the fifth lower-level bit signal D[4] by performing the counting operation while the latch operation selectively stops during the counting section CS.

In accordance with the embodiment of the present invention, loading time and power consumption may be reduced by stopping the latch operation during the counting section, and accumulative counting may be performed by the latch operation during the holding section. Also, the adaptability to operation conditions is improved by controlling the number of division blocks where the latch operation stops based on operation frequency.

In accordance with the embodiments of the present invention, power consumption may be reduced by controlling whether to perform a latch operation or not during a counting section based on operation frequency.

Figure 12:
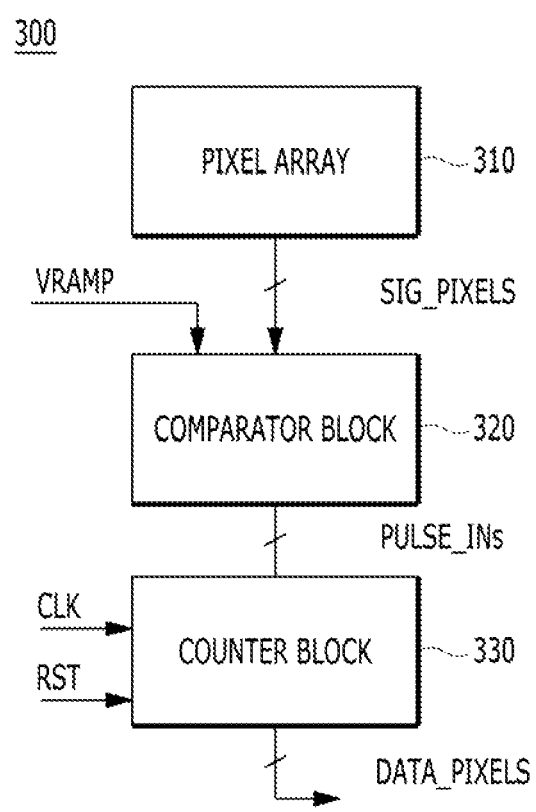
FIG. 12 is a block diagram illustrating an image sensing device in accordance with an embodiment of the present invention.

FIG. 12 is a block diagram Illustrating an image sensing device 300 in accordance with an embodiment of the present invention.

Referring to FIG. 12, the image sensing device 300 may include a pixel array 310, a comparator block 320, and a counter block 330. For example, the image sensing device 300 may be a CMOS image sensor, and the comparator block 320 and the counter block 330 may form an analog-to-digital converter (ADC) block.

The pixel array 310 includes a plurality of pixels. The pixel array 310 may generate a plurality of pixel signals SIG_PIXELs corresponding to incident light, which have analog values. The comparator block 320 includes a plurality of comparators corresponding to the respective pixel signals SIG_PIXELs. The comparator block 320 may compare the pixel signals SIG_PIXELs with a ramp signal (a reference signal) VRAMP to generate a plurality of count enable signals PULSE_INs corresponding to the comparison result.

The counter block 330 includes a plurality of counters. The counter block 330 may perform counting operations based on a source clock signal CLK, an initialization signal RST and the count enable signals PULSE_INs to generate pixel data DATA_PIXELs which have digital values. For example, the counter included in the counter block 330 may include the counting circuit 120A of FIG. 2. In addition, the counter included in the counter block 330 may include the counting circuit 220A of FIG. 10. In such case, the counter block 330 may further receive the number control signals CTRL<0:m>.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the scope of the present invention as defined by the following claims.

What is claimed is:

1. An electronic device, comprising:
   a first portion suitable for generating a hold control signal based on a count enable signal; and
   a second portion suitable for performing a counting operation while a latch operation stops during a counting section and the latch operation while the counting operation stops during a holding section based on the hold control signal and a counting clock signal.

2. The electronic device of claim 1, wherein the second portion includes:
   a plurality of division blocks suitable for generating a plurality of division clock signals divided at respectively predetermined division ratios as compared with the counting clock signal during the counting section, and latching the division clock signals during the holding section based on the counting clock signal or one among the division clock signals and the hold control signal.

3. The electronic device of claim 2, wherein the division blocks include:
   a plurality of first gating units suitable for outputting a plurality of complementary division signals based on the counting clock signal or one among the division clock signals;
   a plurality of first inversion units suitable for inverting a plurality of first output signals outputted from the first gating units;

a plurality of second inversion units suitable for inverting a plurality of first inversion signals outputted from the first inversion units and feeding back the inverted first inversion signals to the first inversion units;

a plurality of second gating units suitable for selectively coupling the first inversion units and the second inversion units with each other based on the hold control signal;

a plurality of third gating units suitable for outputting the first inversion signals based on an inversion signal of the counting clock signal or an inversion signal among the division clock signals;

a plurality of third inversion units suitable for inverting a plurality of second output signals outputted from the third gating units and generating the division clock signals;

a plurality of fourth inversion units suitable for inverting the division clock signals, and feeding back the inverted division clock signals to the third Inversion units; and a plurality of fourth gating units suitable for selectively coupling the third inversion units and the fourth inversion units with each other based on the hold control signal.

4. The electronic device of claim 3, wherein the second gating units are formed between input terminals of the first inversion units and output terminals of the second inversion units and continuously decouple the first inversion units and the second inversion units from each other during the counting section and continuously couple the first inversion units and the second inversion units with each other during the holding section, and the fourth gating units are formed between input terminals of the third inversion units and output terminals of the fourth inversion units and continuously decouple the third inversion units and the fourth inversion units from each other during the counting section and continuously couple the third inversion units and the fourth inversion units with each other during the holding section.

5. The electronic device of claim 2, wherein the division blocks include:

a plurality of first gating units suitable for outputting a plurality of complementary division signals based on the counting clock signal or one among the division clock signals;

a plurality of first inversion units suitable for inverting a plurality of first output signals outputted from the first gating units;

a plurality of second inversion units suitable for inverting a plurality of first inversion signals outputted from the first inversion units based on the hold control signal and feeding back the inverted first inversion signals to the first inversion units;

a plurality of second gating units suitable for outputting the first inversion signals based on an inversion signal of the counting clock signal or an inversion signal among the division clock signals;

a plurality of third inversion units suitable for inverting a plurality of second output signals outputted from the second gating units and generating the division clock signals; and a plurality of fourth inversion units suitable for inverting the division clock signals based on the hold control signal and feeding back the inverted division clock signals to the third inversion units.

6. The electronic device of claim 5, wherein each of the second inversion units and the fourth inversion units includes a gated inverter that is disabled during the counting section and enabled during the holding section based on the hold control signal.

7. An electronic device, comprising:

a control logic portion suitable for generating a hold control signal and a counting clock signal based on a count enable signal and a source clock signal;

a lower-level bit counting portion suitable for performing a counting operation while a latch operation stops during a counting section and performing the latch operation while the counting operation stops during a holding section, based on the hold control signal and the counting clock signal; and an upper-level bit counting portion suitable for performing the counting operation while the latch operation selectively stops during the counting section and performing the latch operation while the counting operation stops during the holding section, based on an uppermost lower-level bit signal among one or more lower-level bit signals outputted from the lower-level bit counting portion.

8. The electronic device of claim 7, wherein the control logic portion includes:

a clock sampling block suitable for generating the counting clock signal toggling during the counting section based on the count enable signal and the source clock signal; and an inversion block suitable for inverting the count enable signal to generate the hold control signal.

9. The electronic device of claim 7, wherein the lower-level bit counting portion includes:

a plurality of lower-level bit division blocks suitable for generating a plurality of lower-level bit signals divided at respectively predetermined division ratios as compared with the counting clock signal during the counting section and latching the lower-level bit signals during the holding section based on the counting clock signal or one among the lower-level bit signals and the hold control signal.

10. The electronic device of claim 9, wherein the lower-level bit division blocks include:

a plurality of first gating units suitable for receiving a plurality of complementary lower-level bit signals based on the counting clock signal or one among the lower-level bit signals;

a plurality of first inversion units suitable for inverting a plurality of first output signals outputted from the first gating units;

a plurality of second inversion units suitable for inverting a plurality of first inversion signals outputted from the first inversion units and feeding back the inverted first inversion signals to the first inversion units;

a plurality of second gating units suitable for selectively coupling the first inversion units and the second inversion units with each other based on the hold control signal;

a plurality of third gating units suitable for outputting the first inversion signals based on an inversion signal of the counting clock signal or an inversion signal among the lower-level bit signals;

a plurality of third inversion units suitable for inverting a plurality of second output signals outputted from the third gating units and generating the lower-level bit signals;

a plurality of fourth inversion units suitable for inverting the lower-level bit signals and feeding back the inverted lower-level bit signals to the third inversion units; and a plurality of fourth gating units suitable for selectively coupling the third inversion units and the fourth inversion units with each other based on the hold control signal.

11. The electronic device of claim 10, wherein the second gating units are formed between input terminals of the first inversion units and output terminals of the second inversion units and continuously decouple the first inversion units and the second inversion units from each other during the counting section and continuously couple the first inversion units and the second inversion units with each other during the holding section, and the fourth gating units are formed between input terminals of the third inversion units and output terminals of the fourth inversion units and continuously decouple the third inversion units and the fourth inversion units from each other during the counting section and continuously couple the third Inversion units and the fourth inversion units with each other during the holding section.

12. The electronic device of claim 9, wherein the lower-level bit division blocks include:

a plurality of first gating units suitable for receiving a plurality of complementary lower-level bit signals based on the counting clock signal or one among the lower-level bit signals;

a plurality of first inversion units suitable for inverting a plurality of first output signals outputted from the first gating units;

a plurality of second inversion units suitable for inverting a plurality of first inversion signals outputted from the first inversion units based on the hold control signal and feeding back the inverted first inversion signals to the first inversion units;

a plurality of second gating units suitable for outputting the first inversion signals based on an inversion signal of the counting clock signal or an inversion signal among the lower-level bit signals;

a plurality of third inversion units suitable for inverting a plurality of second output signals outputted from the second gating units and generating the lower-level bit signals; and a plurality of fourth inversion units suitable for inverting the lower-level bit signals based on the hold control signal and feeding back the inverted lower-level bit signals to the third inversion units.

13. The electronic device of claim 12, wherein each of the second inversion units and the fourth inversion units include a gated inverter that is disabled during the counting section and enabled during the holding section based on the hold control signal.

14. The electronic device of claim 7, wherein the upper-level bit counting portion includes:

a plurality of upper-level bit division blocks suitable for generating a plurality of upper-level bit signals divided at respectively predetermined division ratios as compared with the uppermost lower-level bit signal during the counting section and latching the upper-level bit signals during the holding section based on the uppermost lower-level bit signal or one among the upper-level bit signals.

15. The electronic device of claim 14, wherein the upper-level bit division blocks include:

a plurality of first gating units suitable for receiving a plurality of complementary upper-level bit signals based on the uppermost lower-level bit signal or one among the upper-level bit signals;

a plurality of first inversion units suitable for inverting a plurality of first output signals outputted from the first gating units;

a plurality of second inversion units suitable for inverting a plurality of first inversion signals outputted from the first inversion units and feeding back the inverted first inversion signals to the first inversion units;

a plurality of second gating units suitable for selectively coupling the first inversion units and the second inversion units with each other based on an inversion signal of the uppermost lower-level bit signal or an inversion signal of one among the upper-level bit signals;

a plurality of third gating units suitable for outputting the first inversion signals based on the inversion signal of the uppermost lower-level bit signal or the inversion signal of one among the upper-level bit signals;

a plurality of third inversion units suitable for inverting a plurality of second output signals outputted from the third gating units and generating the upper-level bit signals;

a plurality of fourth inversion units suitable for inverting the upper-level bit signals and feeding back the inverted upper-level bit signals to the third inversion units; and a plurality of fourth gating units suitable for selectively coupling the third inversion units and the fourth inversion units with each other based on the uppermost lower-level bit signal or one among the upper-level bit signals.

16. The electronic device of claim 14, wherein the upper-level bit division blocks include:

a plurality of first gating units suitable for receiving a plurality of complementary upper-level bit signals based on the uppermost lower-level bit signal or one among the upper-level bit signals;

a plurality of first inversion units suitable for inverting a plurality of first output signals outputted from the first gating units;

a plurality of second inversion units suitable for inverting a plurality of first inversion signals outputted from the first inversion units and feeding back the inverted first Inversion signals to the first inversion units based on an inversion signal of the uppermost lower-level bit signal or an inversion signal of one among the upper-level bit signals;

a plurality of second gating units suitable for outputting the first inversion signals based on the inversion signal of the uppermost lower-level bit signal or the inversion signal of one among the upper-level bit signals;

a plurality of third inversion units suitable for inverting a plurality of second output signals outputted from the second gating units and generating the upper-level bit signals; and a plurality of fourth inversion units suitable for inverting the upper-level bit signals and feeding back the inverted upper-level bit signals to the third inversion units based on the uppermost lower-level bit signal or one among the upper-level bit signals.

* * * * *